United States Patent
Lallier

(10) Patent No.: US 6,291,410 B1
(45) Date of Patent: Sep. 18, 2001

(54) COMPOSITIONS FOR THE STRIPPING OF PHOTORESISTS IN THE FABRICATION OF INTEGRATED CIRCUITS

(75) Inventor: Jean-Pierre Lallier, Herblay (FR)

(73) Assignee: ELF Atochem S.A., Puteaux (FR)

( * ) Notice: Subject to any disclaimer, the term of this patent is extended or adjusted under 35 U.S.C. 154(b) by 0 days.

(21) Appl. No.: 09/556,316

(22) Filed: Apr. 24, 2000

(30) Foreign Application Priority Data

Apr. 26, 1999 (FR) .................................................. 99 05237

(51) Int. Cl.$^7$ ................................ C11D 3/28; C11D 3/20; C11D 3/30
(52) U.S. Cl. .................. 510/176; 510/175; 510/178; 510/245; 510/255; 510/258; 510/264; 510/500
(58) Field of Search ..................................... 510/175, 176, 510/178, 245, 255, 258, 264, 500; 134/2, 39, 41

(56) References Cited

U.S. PATENT DOCUMENTS

| | | | |
|---|---|---|---|
| 5,417,877 | 5/1995 | Ward | 252/153 |
| 5,496,491 | 3/1996 | Ward et al. | 252/153 |
| 5,556,482 | * 9/1996 | Ward et al. | 134/38 |
| 5,834,411 | * 11/1998 | Bolkan et al. | 510/245 |

FOREIGN PATENT DOCUMENTS

0 578 507 A2  7/1993  (EP).
0 596 515 A1  11/1993  (EP).

* cited by examiner

*Primary Examiner*—Gregory Delcotto
(74) *Attorney, Agent, or Firm*—Smith, Gambrell & Russell, LLP

(57) ABSTRACT

For the stripping of photoresists, the invention proposes to use a mixture of dimethyl sulphoxide DMSO) or N-methylpyrrolidone (NMP) and 3-methoxypropylamine (MOPA).

Advantageously, a little water and a corrosion inhibitor, such as sodium tolyltriazolate, are added to the mixture.

11 Claims, 2 Drawing Sheets

COMPOSITIONS FOR THE STRIPPING OF PHOTORESISTS IN THE FABRICATION OF INTEGRATED CIRCUITS

FIELD OF THE INVENTION

The present invention relates to the field of integrated circuits and the subject of the invention is more particularly a composition for stripping the photosensitive resins used for the fabrication of integrated circuits.

BACKGROUND OF THE INVENTION

The basic technique used to fabricate an integrated circuit is photolithography. According to the so-called planar process invented by the company Fairchild in 1959, a wafer of pure (to within 1 ppm) polycrystalline silicon approximately 0.7 mm in thickness and 200 mm in diameter, the surface of which has been polished in order to make it perfectly smooth, is covered with an etching layer consisting of a dielectric (for example $SiO_2$) or of a metal (for example aluminium) and then the assembly is coated with a 1 to 2 $\mu$m thick film of a photoresist (hereinafter called PR), i.e. a photosensitive resin composed of a polymer and a photosensitizer. Next, visible or advantageously ultraviolet light is projected through a mask, the opaque surfaces of which form the replica of the desired pattern, so that certain parts of the PR resin are exposed and others are not. After this exposure step, the PR resin is developed either, if it is a positive PR, in a basic solution which dissolves the exposed parts or, if it is a negative PR, in an organic solvent which dissolves the masked parts. In the recesses thus formed, the exposed region of the dielectric ($SiO_2$, modified silica, silicon carbide) or metal (Al, Cu, Cr, W, etc.) layer is then removed by an acid solution or by plasma. After this so-called etching operation, the residue of PR resin must then be removed by a so-called PR stripping operation and, as shown in the diagram in the appended FIG. 1, a positive image or a negative image is finally obtained.

Figure 1:
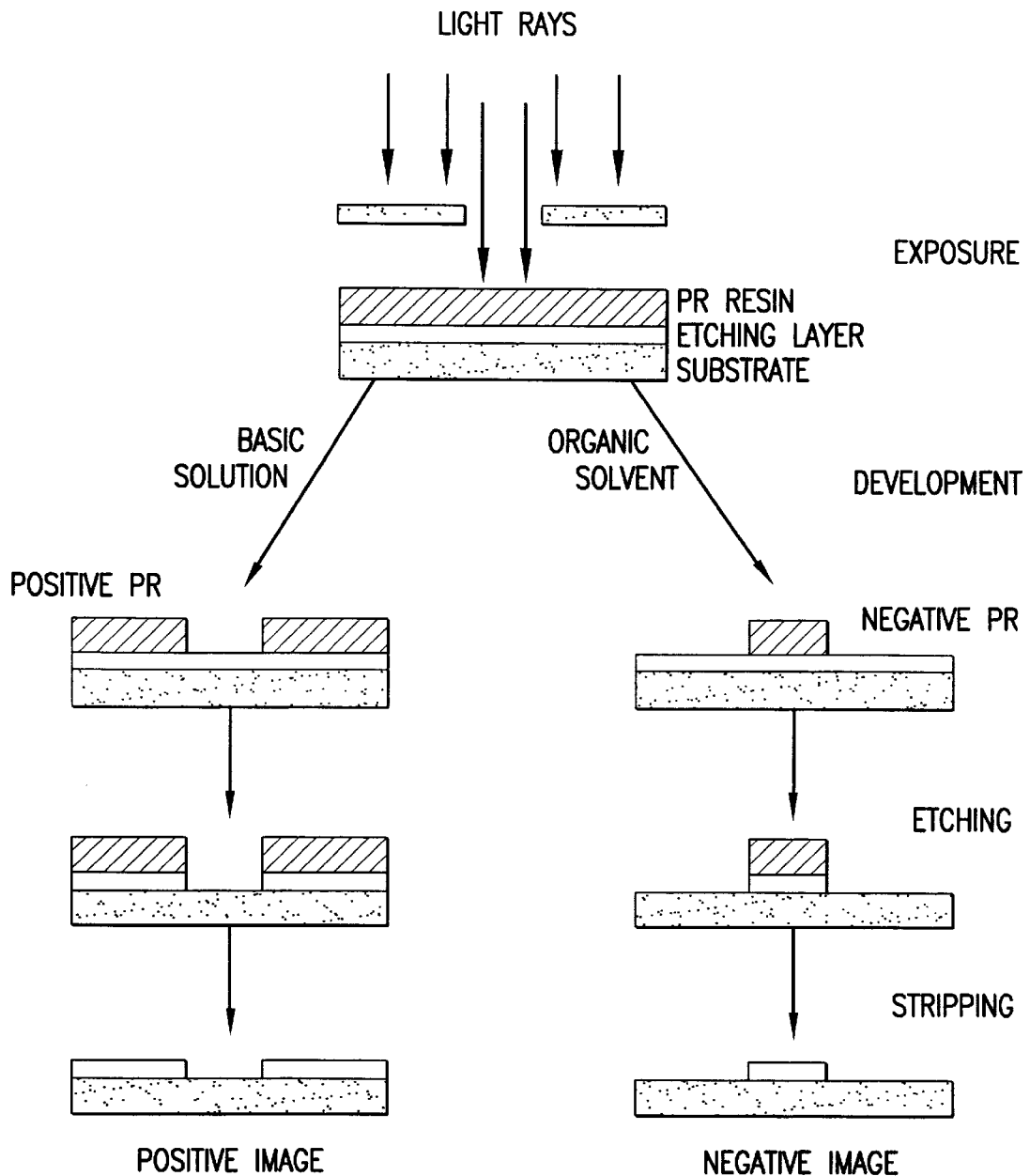

The fabrication of integrated circuits is an extremely elaborate industrial operation, of which the above description and the diagram in FIG. 1 give here merely a general idea. Its difficulty essentially resides in the small size of the objects which are handled, since the transistors currently fabricated have a gate width of 0.25 $\mu$m. The fabrication must be carried out in chambers called clean rooms, from which dust is systematically removed; class I clean rooms contain less than 30 particles of size greater than 0.12 $\mu$m per $m^3$ while a normal room contains 530 million such particles per $m^3$.

A photoresist is a formulation of organic compounds whose solubility changes when it is exposed to light radiation. Initially developed for the printing industry, the photoresist formulations have been used for about thirty years in microlithography for the fabrication of integrated circuits; their composition (weight %) is generally as follows:

| | | |
|---|---|---|
| resin | => | 25–55% |
| photosensitizer | => | 2–30% |
| solvents | => | 40–70% |
| additives | => | 10–1000 ppm |

Exposing a photoresist causes a chemical transformation which modifies its solubility in certain solvents or under certain pH conditions. Thus, the exposed regions of a positive photoresist are the seat of photochemical rearrangement reactions and become more soluble in alkaline solutions than those regions not exposed to the radiation. In the case of a Chemically Amplified Photoresist (CAP), the photoresist polymer is rendered soluble because, under illumination, a second chemical compound (acid photogenerator) releases an acid; this acid has a catalytic action on the polymer because it induces a chemical reaction causing the appearance of soluble groups in a basic developer. In the case of negative photoresist resins, the exposed parts are the seat of a photopolymerization reaction which results in the formation of a medium consisting of macromolecules whose molecular masses are much higher than those initially; it follows that there is an appreciable decrease in the solubility in an organic solvent.

Positive photoresists are generally easier to strip than negative photoresists. This is due to the fact that the positive resins to be stripped have not been exposed to the radiation, unlike the negative resins which have become modified and are often insoluble in most solvents. However, more than the PR itself, it is in fact a polymer called SWP (Side Wall Polymer) which forms on the sides of the patterns during plasma etching that is the most difficult to remove. Typically, this polymer contains metal atoms, carbon atoms and halogen (Cl, F, Br) atoms.

There are two methods for removing the photoresist from the wafer:

1̂ "dry stripping" or "ashing", which uses oxygen plasma, and

2̂"wet stripping", which uses solvents.

These two methods do not act in the same way on the photoresist and are used, for most of the time, complementarily so as to combine the advantages of each of them. This is because dry stripping removes the PR better than the contaminants, and vice versa in the case of wet stripping. Dry stripping is particularly ineffective for removing SWPs.

Halogenated hydrocarbons (methylene chloride or tetrachloroethylene) were the first PR strippers used; they had the advantage of stripping both positive and negative PRs, with complete effectiveness. However, their high toxicity with respect to the environment and their excessively high volatility have forced the electronics industry to seek replacement formulations.

DETAILED DESCRIPTION OF THE INVENTION AND BRIEF DESCRIPTION OF THE DRAWINGS

It has now been discovered that it is possible to obtain excellent performance in stripping negative photoresists and positive photoresists by using a mixture of dimethyl sulphoxide (DMSO) or N-methylpryrrolidone (NMP) and 3-methoxypropylamine (MOPA).

The mixture according to the invention contains, by mass, from 30 to 95% DMSO or NMP and from 70 to 5% MOPA. Preferably, a mixture containing 65 to 95% DMSO or NMP and 35 to 5% MOPA is used; a more particularly preferred mixture is that which contains approximately 70% by weight DMSO and 30% by weight MOPA.

The DMSO-MOPA and NMP-MOPA mixtures according to the invention can be used as they are for the tripping of photoresists, but it is advantageous to add a little water to them, in an amount from 0 to 10 parts (preferably 0.3 to 7 parts) by weight of water per 100 parts of DMSO-MOPA or NMP-MOPA mixture.

It is also advantageous to introduce into the stripping compositions according to the invention a small amount of corrosion inhibitor, such as catechol and, preferably, sodium tolyltriazolate. This amount may range up to 10 parts by weight per 100 parts of DMSO-MOPA or NMP-MOPA mixture, but it is preferably between 0.3 and 7 parts.

A particularly preferred composition for the stripping of positive photoresists comprises approximately 69 parts of DMSO, 30 parts of MOPA, 0.5 parts of sodium tolyltriazolate and 0.5 parts of water. This composition may also be used for the post-stipping cleaning of a Cu/dielectric low-k circuit.

The stripping compositions according to the invention may be used at a temperature of between ambient temperature and 50° C., preferably between 20 and 30° C.

EXAMPLES

The following examples illustrate the invention without limiting it.

EXAMPLE 1

Wafers with silica patterns and a positive PR (thickness =1 $\mu$m) based on a positive resin (Shipley DUV XP 90166) were used.

Figure 2:
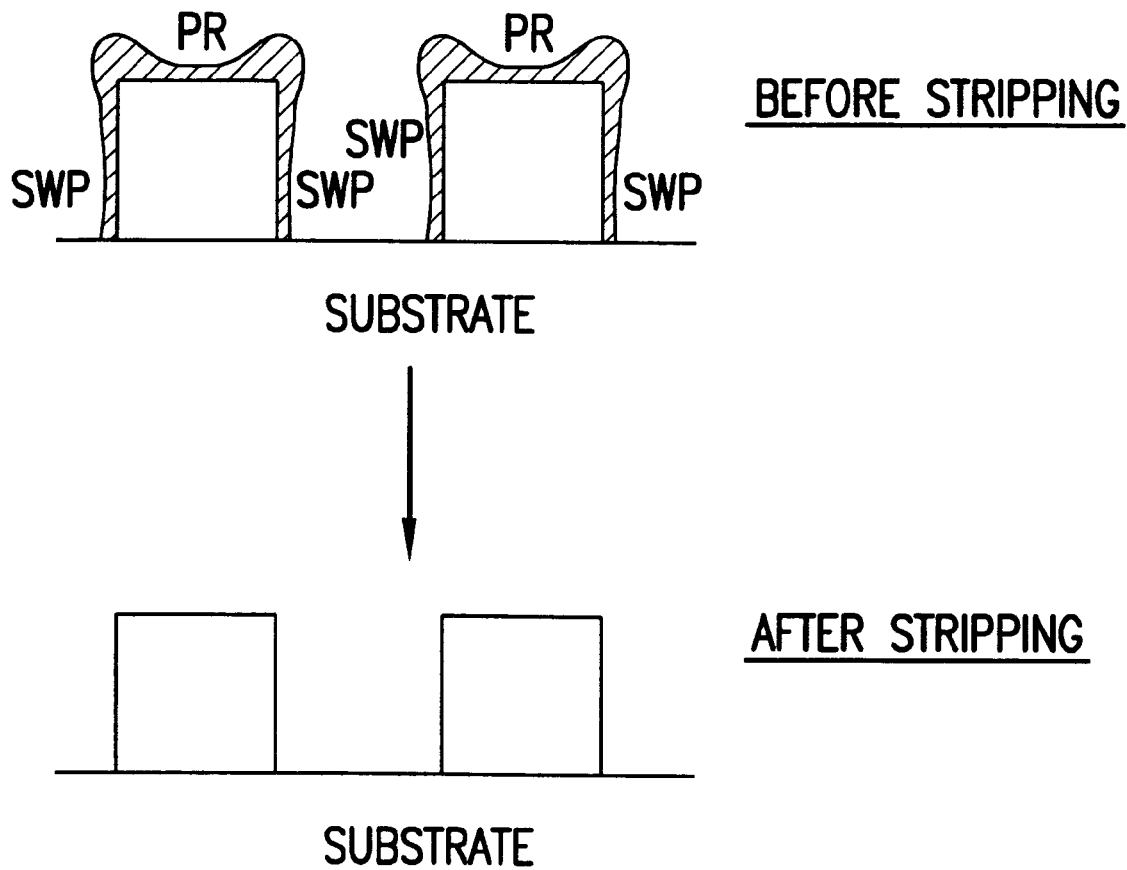

The patterns to be stripped were partially covered with PR resin on the top and with SWP on the sides, giving them a characteristic convex shape. An effective stripper must be capable of removing these coatings and the residues between the patterns without, however, attacking the pattern itself. Only by viewing with a scanning electron microscope allowing magnifications of ×10,000 to ×100,000 enables the morphology to be effectively and reproducibly evaluated. Effective stripping corresponds to the morphological transformation illustrated in FIG. 2.

These wafers with SiO$_2$ patterns and positive PR were stripped by means of three mixtures A, B and C according to the invention, these having the composition by weight indicated in the following table:

| Mixtures | DMSO | MOPA | Catechol | Water |
|---|---|---|---|---|
| A | 35 | 55 | 5 | 5 |
| B | 60 | 30 | 5 | 5 |
| C | 81 | 9 | 5 | 5 | the process being carried out according to the following four-step procedure:
 (a) Stripping at 25° C. for 30 minutes with ultrasound stirring;
 b) Prerinsing for 5 minutes at 25° C. using the same formulation as for the stripping, with circular stirring (50 rpm) in order to improve removal of the residues;
 (c) Rinsing for 15 minutes with doubly deionized water at 25° C. with circular stirring; and
 (d) Drying in air at 80° C. for 10 minutes.

After this treatment, scanning electron microscope examination (magnification: 10,000) of the wafers showed excellent SWP and PR removal without the silica patterns being attacked.

EXAMPLE 2

As good results were obtained by replacing in Example 1 the mixtures A, B and C by a mixture according to the invention having the following composition by weight:

| | |
|---|---|
| DMSO | 69 parts |
| MOPA | 30 parts |
| Sodium tolyltriazolate | 0.5 part |
| Water | 0.5 part |

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims. The above references are hereby incorporated by reference.

What is claimed is:
1. Composition for the stripping of a photoresist, comprising by mass, from 30 to 95% dimethyl sulphoxide (DMSO) or N-methylpyrrolidone (NMP), and from 70 to 5% 3-methoxypropylamine (MOPA).
2. Composition according to claim 1, wherein the composition contains from 65 to 95% DMSO or NMP and from 35 to 5% MOPA.
3. Composition according to claim 1, wherein the composition contains water in an amount from 0 to 10 parts by weight of water per 100 parts of DMSO-MOPA or NMP-MOPA mixture.
4. Composition according to claim 3, wherein the composition contains 0.3 to 7 parts of water per 100 parts of DMSO-MOPA or NMP-MOPA mixture.
5. Composition according to claim 1, wherein the composition contains a corrosion inhibitor in an amount from 0 to 10 parts per 100 parts of DMSO-MOPA or NMP-MOPA mixture.
6. Composition according to claim 5, wherein the corrosion inhibitor comprises is catechol.
7. Composition according to claim 5, wherein the corrosion inhibitor comprises sodium tolyltriazolate.
8. Composition according to claim 7, wherein the composition comprises 69 parts of DMSO, 30 parts of MOPA, 0.5 part of sodium tolyltriazolate and 0.5 part of water.
9. Method for stripping of a photoresist and/or its post-stripping cleaning comprising treating the photoresist with the composition according to claim 1.
10. Composition according to claim 2, wherein the composition contains approximately 70% DMSO and 30% MOPA.
11. Composition according to claim 5, wherein the amount of inhibitor is from 0.3 to 7 parts per 100 of DMSO-MOPA or NMP-MOPA mixture.

* * * * *